(12) United States Patent
Noguchi et al.

(10) Patent No.: US 11,089,683 B2
(45) Date of Patent: Aug. 10, 2021

(54) OPTICAL MODULE

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 0 days.

(21) Appl. No.: 16/944,717

(22) Filed: Jul. 31, 2020

(65) Prior Publication Data
US 2021/0059050 A1 Feb. 25, 2021

(30) Foreign Application Priority Data
Aug. 21, 2019 (JP) .............................. JP2019-151107

(51) Int. Cl.
*H05K 1/18* (2006.01)
*H05K 1/02* (2006.01)
(Continued)

(52) U.S. Cl.
CPC ............. *H05K 1/118* (2013.01); *H05K 1/028* (2013.01); *H05K 1/189* (2013.01); *H01R 12/62* (2013.01);
(Continued)

(58) Field of Classification Search
CPC ........ H05K 1/118; H05K 1/189; H05K 1/028; H05K 1/113; H05K 1/0253; H05K 1/147; H05K 1/0289; H05K 1/0215; H05K 2201/055; H05K 2201/056; H05K 2201/09063; H05K 2201/09227; H05K 2201/093; H05K 2201/10106; H05K 2201/10356; H05K 2201/10121;
(Continued)

(56) References Cited

U.S. PATENT DOCUMENTS

2003/0085054 A1* 5/2003 Ames ..................... H01R 12/62
174/254
2005/0174190 A1 8/2005 Yagyu et al.
(Continued)

FOREIGN PATENT DOCUMENTS

JP 2004-247980 A 9/2004
JP 2009-105157 A 5/2009
(Continued)

*Primary Examiner* — Roshn K Varghese
(74) *Attorney, Agent, or Firm* — Mattingly & Malur, PC

(57) ABSTRACT

An insulation film has a first surface and a second surface opposite to each other and has a first portion and a second portion extending in a direction opposite to each other from a central portion. The optical subassembly is connected to the flexible printed circuit board at the central portion with the stem opposed to the second surface. The flexible printed circuit board curves with the second surface at least the central portion facing outward. The printed circuit board intervenes between edges of the first portion and the second portion and is connected to the flexible printed circuit board. The first portion and the second portion of the flexible printed circuit board curves in a shape to avoid mutual contact and three-dimensionally intersect with each other, and the first portion and the second portion on the second surface are opposed to the printed circuit board.

8 Claims, 7 Drawing Sheets

(51) Int. Cl.
*H05K 1/11* (2006.01)
*H04B 10/50* (2013.01)
*H01R 12/67* (2011.01)
*H01R 12/62* (2011.01)
*H01R 12/63* (2011.01)
*H04B 10/60* (2013.01)

(52) U.S. Cl.
CPC .............. *H01R 12/63* (2013.01); *H01R 12/67* (2013.01); *H04B 10/50* (2013.01); *H04B 10/60* (2013.01); *H05K 2201/055* (2013.01); *H05K 2201/093* (2013.01); *H05K 2201/09063* (2013.01); *H05K 2201/09227* (2013.01); *H05K 2201/09445* (2013.01); *H05K 2201/10121* (2013.01); *H05K 2201/10356* (2013.01)

(58) Field of Classification Search
CPC ... H05K 2201/09445; H05K 2201/042; H05K 3/361; H04B 10/50; H04B 10/60; H01R 12/67; H01R 12/62; H01R 12/63; G02B 6/4281

See application file for complete search history.

(56) References Cited

U.S. PATENT DOCUMENTS

| | | | |
|---|---|---|---|
| 2009/0123116 A1 | 5/2009 | Tanaka et al. | |
| 2012/0008289 A1* | 1/2012 | Aruga | G02B 6/4292 361/749 |
| 2013/0318786 A1* | 12/2013 | Nakamura | H05K 13/00 29/876 |
| 2016/0286657 A1* | 9/2016 | Ban | H05K 1/118 |

FOREIGN PATENT DOCUMENTS

| | | |
|---|---|---|
| JP | 2010-200234 | 9/2010 |
| JP | 2011-091295 A | 5/2011 |

\* cited by examiner

OPTICAL MODULE

CROSS-REFERENCE TO RELATED APPLICATION

The present application claims priority from Japanese application JP 2019-151107 filed on Aug. 21, 2019, the content of which is hereby incorporated by reference into this application.

BACKGROUND

1. Field

This relates to an optical module.

2. Description of the Related Art

An optical module has an optical subassembly, a printed circuit board (PCB) on which an integrated circuit (IC) may be mounted for outputting modulation electric signals, and a flexible printed circuit board (FPC) for connecting the optical subassembly and the PCB (JP 2009-105157A and JP 2011-091295A). To reduce impact of crosstalk, a wiring layout may be well-devised at a connection portion between the FPC and the PCB to enhance the ground (JP 2004-247980A and JP 2010-200234A). For example, an optical module using a transistor outline-can (TO-CAN) package type optical subassembly is known.

As disclosed in JP 2009-105157A, with the FPC extending from the optical subassembly in one direction, a high-frequency signal line is made close to a direct-current signal line, deteriorating high-frequency characteristics. Additionally, the impedance should not be made high at the connection portion between the FPC and the PCB.

SUMMARY

This aims at preventing deterioration of high-frequency characteristics and increase of impedance.

(1) An optical module includes: an optical subassembly for converting an optical signal and an electric signal at least from one to another, the optical subassembly having a stem; a flexible printed circuit board having an insulation film with a first surface and a second surface opposite to each other and with a first portion and a second portion extending in a direction opposite to each other from a central portion, the flexible printed circuit board having a first ground plain on the second surface; and a printed circuit board having an insulation layer with a third surface and a fourth surface opposite to each other, the printed circuit board having a second ground plain. The optical subassembly is connected to the flexible printed circuit board with the stem opposed to the second surface at the central portion. The flexible printed circuit board curves with the second surface facing outward at least at the central portion. The printed circuit board intervenes between edges of the first portion and the second portion and is connected to the flexible printed circuit board. The first portion and the second portion of the flexible printed circuit board curves in a shape to avoid mutual contact and three-dimensionally intersect with each other, and the first portion and the second portion on the second surface are opposed to the printed circuit board.

Thus, no insulation film intervenes between the first ground plain and the printed circuit board, preventing deterioration of high-frequency characteristics and increase of impedance.

(2) In the optical module according to (1), the flexible printed circuit board on the second surface may have a first ground terminal connected to the first ground plain, the printed circuit board on the third surface may have a second ground terminal connected to the second ground plain, and the first ground terminal and the second ground terminal may be connected to each other.

(3) In the optical module according to (1) or (2), the flexible printed circuit board at the central portion and the first portion on the first surface may have a first interconnect pattern, the flexible printed circuit board at the first portion on the second surface may have a first terminal connected to the first interconnect pattern, the printed circuit board may have a third interconnect pattern, the printed circuit board on the third surface may have a third terminal connected to the third interconnect pattern, and the first terminal and the third terminal may be connected to each other.

(4) In the optical module according to (3), the first ground plain may be at the central portion and at the first portion and may overlap with the first interconnect pattern, and the first interconnect pattern may include a high-frequency signal line.

(5) In the optical module according to (3) or (4), the flexible printed circuit board at the central portion and the second portion on the first surface may have a second interconnect pattern, the flexible printed circuit board at the second portion on the second surface may have a second terminal connected to the second interconnect pattern, the printed circuit board may have a fourth interconnect pattern, the printed circuit board on the fourth surface may have a fourth terminal connected to the fourth interconnect pattern, and the second terminal and the fourth terminal may be connected to each other.

(6) In the optical module according to claim 5, the second interconnect pattern may include a direct-current signal line.

(7) In the optical module according to any one of (1) to (6), one of the first portion and the second portion of the insulation film may have an opening or a cutout.

(8) In the optical module according to (7), the second portion may have the opening or the cutout, and the first portion may be situated inside the opening or the cutout.

DETAILED DESCRIPTION

Figure 1:
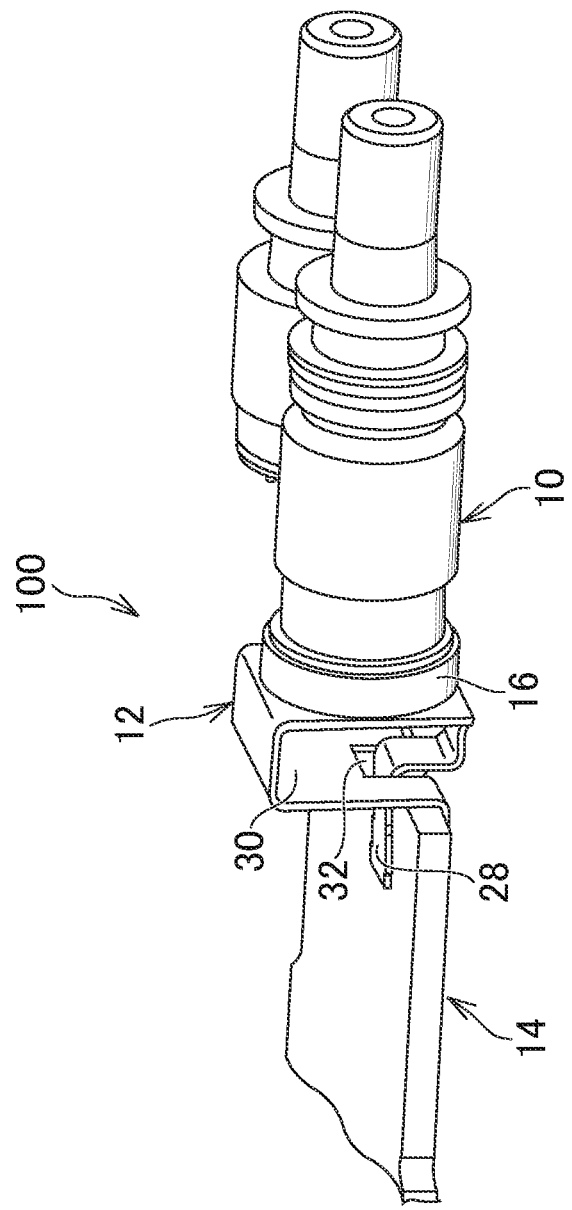
FIG. 1 is a top perspective view of an optical module in an embodiment.

Hereinafter, some embodiments will be described specifically and in detail with reference to drawings. In all the drawings, the members with the same reference numerals have the identical or same function and their repetitive description will be omitted. Sizes of figures do not always comply with magnification.

Figure 2:
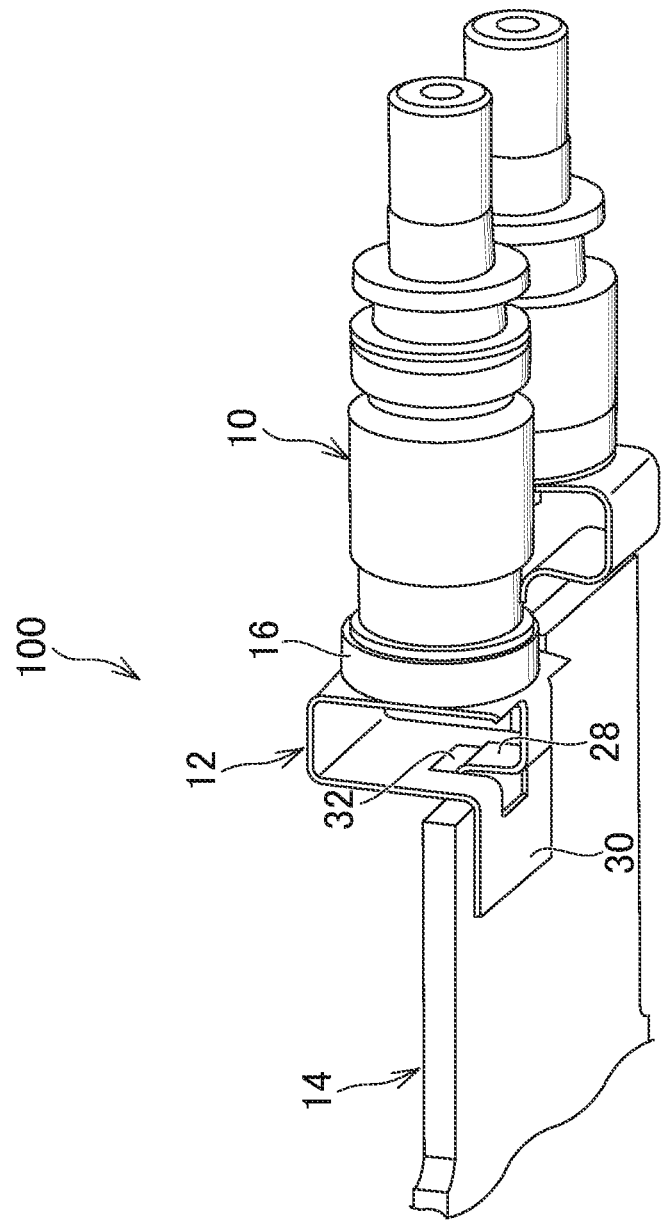
FIG. 2 is a bottom perspective view of the optical module in the embodiment.

FIG. 1 is a top perspective view of an optical module in an embodiment. FIG. 2 is a bottom perspective view of the optical module in the embodiment. An optical module 100 is an optical transceiver with an optical transmitting function and an optical receiving function, applicable to a quad small form factor pluggable 28 (QSFP28), with a transmission rate of 100 Gbit/s, although any other standard or transmission rate may be adopted.

The optical module 100 includes an optical subassembly 10, a flexible printed circuit board 12, and a printed circuit board (PCB) 14, stored in an unillustrated housing. The flexible printed circuit board 12 and the printed circuit board 14 are connected to each other. The optical subassembly 10 and the printed circuit board 14 are connected through the flexible printed circuit board 12.

Figure 3:
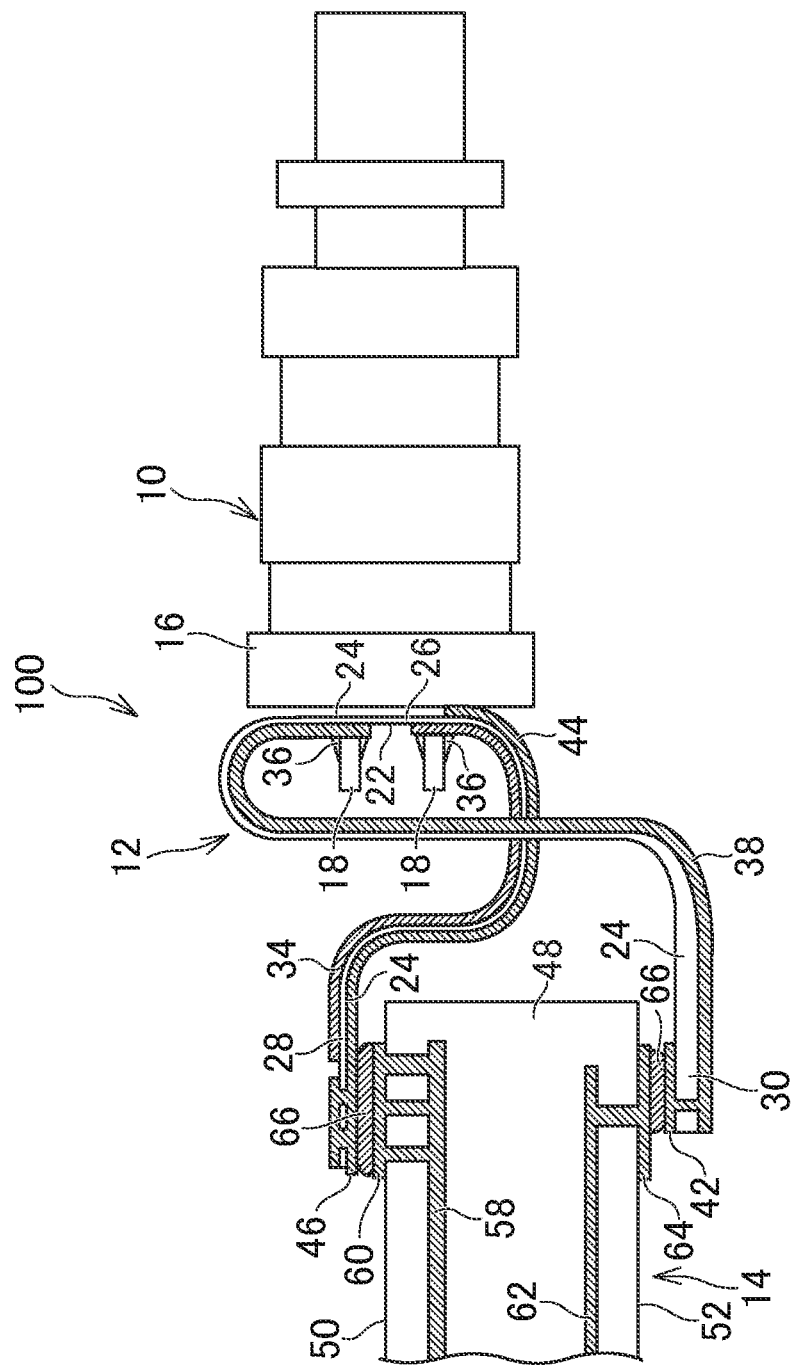
FIG. 3 is a schematic view of connection structure of an optical subassembly, a flexible printed circuit board, and a printed circuit board.

FIG. 3 is a schematic view of connection structure of an optical subassembly 10, a flexible printed circuit board 12, and a printed circuit board 14. The optical subassembly 10 is configured to convert an optical signal and an electric signal at least from one to another. The optical subassembly 10 may be a transmitter optical subassembly (TOSA) with a light-emitting element such as a laser diode stored therein for converting an electric signal to an optical signal and sending the optical signal, a receiver optical subassembly (ROSA) with a light-receiving element such as a photodiode stored therein for converting a received optical signal to an electric signal, or a bidirectional optical subassembly (BOSA) with both functions.

The electric signal is transmitted from the printed circuit board 14 through the flexible printed circuit board 12 to the transmitter optical subassembly. The electric signal is transmitted from the receiver optical subassembly through the flexible printed circuit board 12 to the printed circuit board 14.

The optical subassembly 10 has a stem 16. The stem 16 is made of conductive materials and is set to ground potential. A lead pin 18 is used for external connection of electric signals. The lead pin 18 is in no contact with and inside a through-hole (not shown) in the stem 16, constituting a coaxial line with a high-frequency signal line surrounded with the ground potential.

Figure 4:
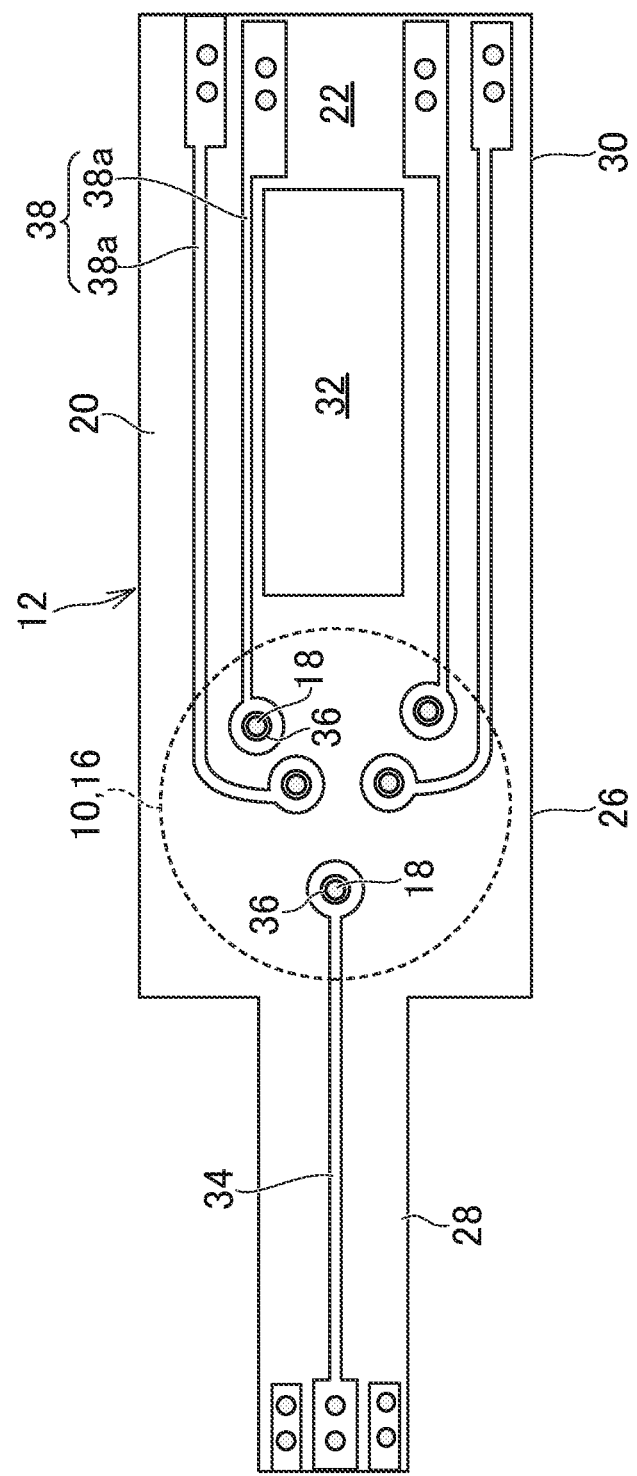
FIG. 4 is a developed view of the flexible printed circuit board to which the optical subassembly is connected.
Figure 5:
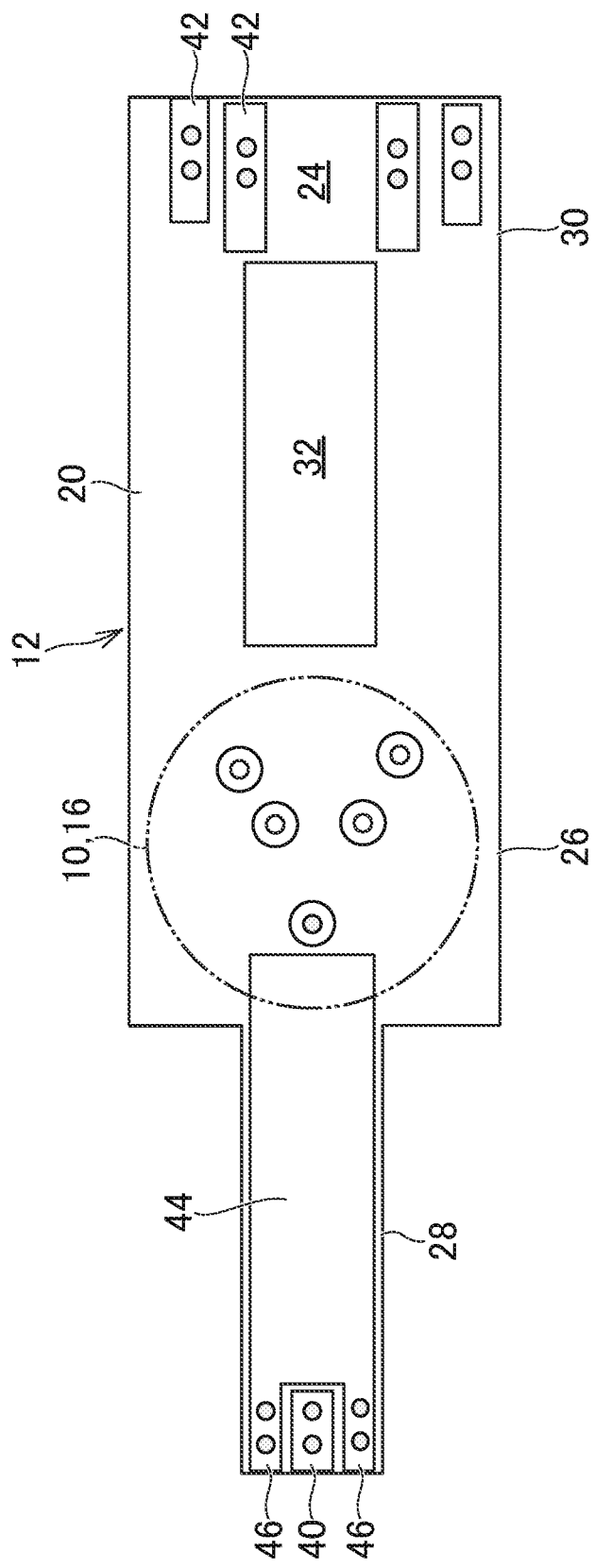
FIG. 5 is a diagram of a second surface of the flexible printed circuit board.

FIG. 4 is a developed view of the flexible printed circuit board 12 to which the optical subassembly 10 is connected. The flexible printed circuit board 12 has an insulation film 20. The insulation film 20 has a first surface 22 and a second surface 24 opposite to each other (FIG. 5). The insulation film 20 has a first portion 28 and a second portion 30 oppositely extending from a central portion 26.

One (e.g. the second portion 30) of the first portion 28 and the second portion 30 of the insulation film 20 has an opening 32 or a cutout. In FIG. 1 or FIG. 2, the first portion 28 is disposed to run through the opening 32 or a cutout. Correspondingly, the opening 32 or a cutout is larger in width than the first portion 28.

The flexible printed circuit board 12 on the first surface 22 has a first interconnect pattern 34 at the central portion 26 and the first portion 28. The first interconnect pattern 34 includes a high-frequency signal line, may consist of the high-frequency signal line, or may include a line connected to the ground potential but include no line for passing a direct current signal. The first interconnect pattern 34 at the central portion 26 is connected to the lead pin 18. Specifically, the lead pin 18 penetrates the first interconnect pattern 34, and both are bonded with solder 36 or brazing filler (FIG. 3).

The flexible printed circuit board 12 on the first surface 22 has a second interconnect pattern 38 at the central portion 26 and the second portion 30. The second interconnect pattern 38 includes a direct-current signal line, may consist of the direct-current signal line, or may include a line connected to the ground potential but include no line for passing a high-frequency signal. The second interconnect pattern 38 may include some lines 38a arranged between the opening 32 or a cutout. The second interconnect pattern 38 at the central portion 26 is connected to the lead pin 18. Specifically, the lead pin 18 penetrates the second interconnect pattern 38, and both are connected with solder 36 or brazing filler (FIG. 3).

FIG. 5 is a diagram of a second surface 24 of the flexible printed circuit board 12. The second surface 24 is a surface to which the optical subassembly 10 illustrated by a double-dotted line is connected.

A first terminal 40 is disposed on the second surface 24 and at the first portion 28. The first terminal 40 is connected to the first interconnect pattern 34 on the first surface 22 through, for example, a via hole penetrating the insulation film 20 (FIG. 3). The first terminal 40 is at an edge away from the central portion 26 of the first portion 28.

A second terminal 42 is disposed on the second surface 24 at the second portion 30. The second terminal 42 is connected to the second interconnect pattern 38 on the first surface 22 through, for example, a via hole penetrating the insulation film 20 (FIG. 3). The second terminal 42 is at an edge away from the central portion 26 of the second portion 30.

A first ground plain 44 is disposed on the second surface 24 at the central portion 26 and the first portion 28. A part of the first ground plain 44 overlaps with the optical subassembly 10 (the stem 16) and is electrically connected to the stem 16. A first ground terminal 46 is disposed on the second surface 24 and is connected to the first ground plain 44. A pair of first ground terminals 46 may sandwich the first terminal 40. The first ground plain 44 overlaps with the first interconnect pattern 34 on the first surface 22. This makes it possible to form a microstrip line or a grand coplanar line.

In FIG. 3, the optical subassembly 10 is connected to the flexible printed circuit board 12. The stem 16 of the optical subassembly 10 is opposed to the second surface 24 at the central portion 26 of the flexible printed circuit board 12.

There is a first ground plain 44 on the second surface 24, the ground potential of the flexible printed circuit board 12 can be connected to the stem 16 without loss, reducing impedance between the ground conductors.

In FIG. 3, the flexible printed circuit board 12 curves at least at the central portion 26 with the second surface 24 facing outward. The first portion 28 and the second portion 30 of the flexible printed circuit board 12 curve to three-dimensionally intersect with each other in shapes to avoid mutual contact. In other words, the first portion 28 and the second portion 30 curve to overlap with each other when viewed in a direction along the first surface 22 or the second surface 24. The curved shape is made, as shown in FIG. 1 or FIG. 2, due to the first portion 28 passing in the opening 32 of the second portion 30 or a cutout.

In FIG. 3, the optical module 100 has the printed circuit board 14. The printed circuit board 14 has an insulation layer 48. The insulation layer 48 has a third surface 50 and a fourth surface 52 opposite to each other. Assuming the insulation layer 48 consists of multiple layers, each of the third surface 50 and the fourth surface 52 is the outermost surface.

Figure 6:
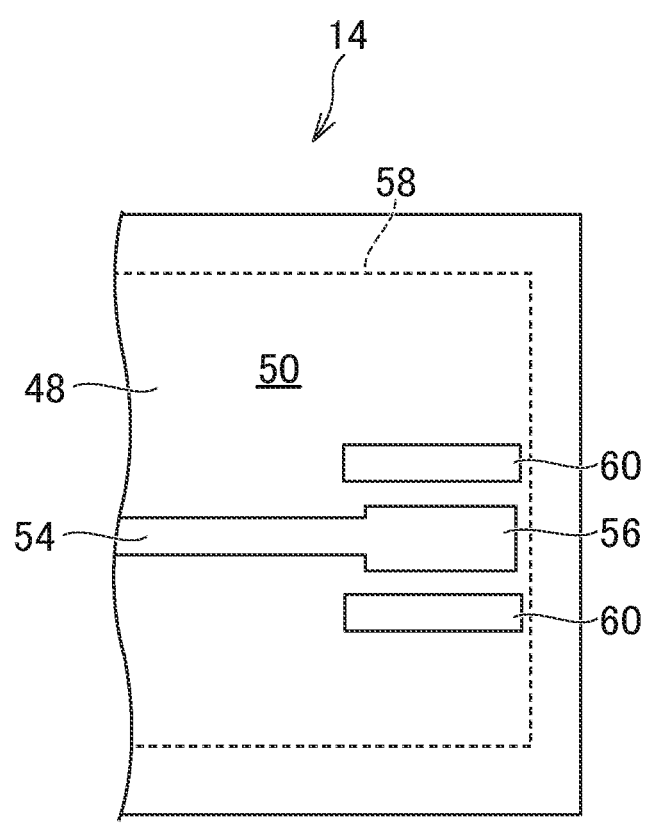
FIG. 6 is a diagram of a third surface of the printed circuit board.

FIG. 6 is a diagram of a third surface 50 of the printed circuit board 14. The printed circuit board 14 has a third interconnect pattern 54. A third terminal 56 is connected to the third interconnect pattern 54. The third terminal 56 is on the third surface 50, and the third interconnect pattern 54 is also on the third surface 50.

The printed circuit board 14 includes a microstrip line and a grand coplanar line for transmitting the high-frequency signal to the third interconnect pattern 54. Specifically, the printed circuit board 14 has a second ground plain 58. A second ground terminal 60, connected to the second ground plain 58, is on the third surface 50. The second ground plain 58 in FIG. 6 overlaps with the third interconnect pattern 54.

Figure 7:
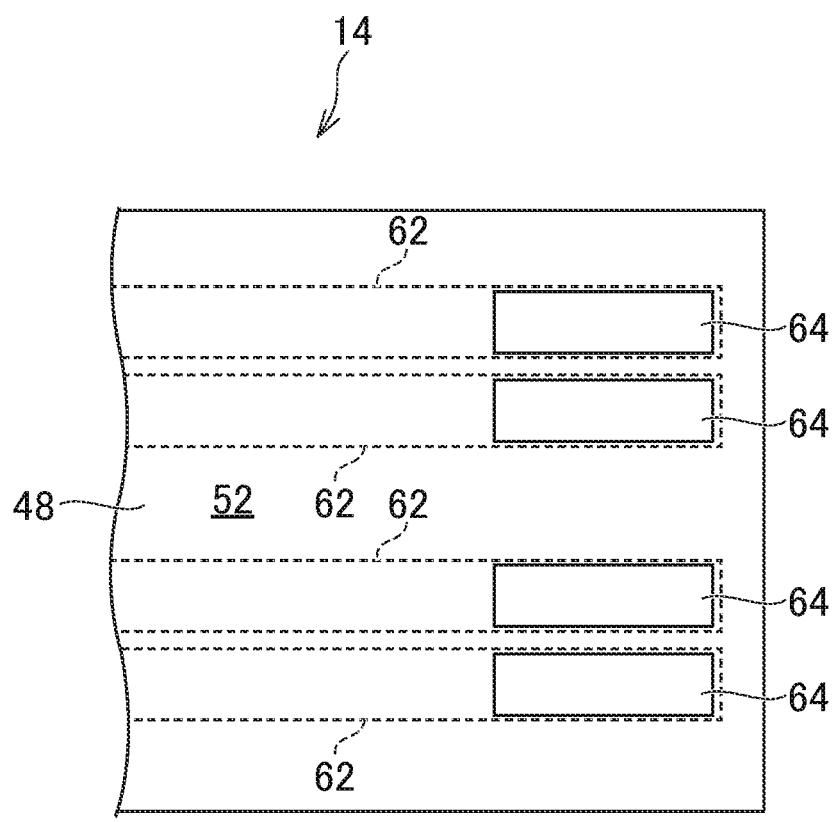
FIG. 7 is a diagram of a fourth surface of the printed circuit board.

FIG. 7 is a diagram of a fourth surface 52 of the printed circuit board 14. The printed circuit board 14 has a fourth interconnect pattern 62. A fourth terminal 64, connected to the fourth interconnect pattern 62, is on the fourth surface 52.

In FIG. 3, the printed circuit board 14 is connected to the flexible printed circuit board 12. The printed circuit board 14 intervenes between edges of the first portion 28 and the second portion 30. The first portion 28 and the second portion 30 of the flexible printed circuit board 12 (the insulation film 20) are opposed to the printed circuit board 14 on the second surface 24.

The first ground terminal 46 of the flexible printed circuit board 12 are connected to the and second ground terminal 60 of the printed circuit board 14. The solder 66 or brazing filler is used for the connection. The second terminal 42 of the flexible printed circuit board 12 is connected to the fourth terminal 64 of the printed circuit board 14. The solder 66 or brazing filler is used for the connection. Additionally, the first terminal 40 (FIG. 5) of the flexible printed circuit board 12 is connected to the third terminal 56 (FIG. 6) of the printed circuit board 14. Solder or brazing filler (not shown) is used for the connection.

In the embodiment, the insulation film 20 does not intervene between the first ground plain 44 and the printed circuit board 14, preventing deterioration of high-frequency characteristics and increase of impedance. The ground potential can be connected to the flexible printed circuit board 12 without loss, reducing parasitic inductance.

In the embodiment, the first ground plain 44 of the flexible printed circuit board 12 is configured to be closer to the ground potential than the signal current of both the printed circuit board 14 and stem 16. The flexible printed circuit board 12 may be separated into the first portion 28 and the second portion 30.

While there have been described what are at present considered to be certain embodiments, it will be understood that various modifications may be made thereto, and it is intended that the appended claims cover all such modifications as fall within the true spirit and scope of the invention.

What is claimed is:

1. An optical module comprising:
    an optical subassembly for converting an optical signal and an electric signal at least from one to another, the optical subassembly having a stem;
    a flexible printed circuit board having an insulation film with a first surface and a second surface opposite to each other and with a first portion and a second portion extending in a direction opposite to each other from a central portion, the flexible printed circuit board having a first ground plain on the second surface; and
    a printed circuit board having an insulation layer with a third surface and a fourth surface opposite to each other, the printed circuit board having a second ground plain,
    wherein
    the optical subassembly is connected to the flexible printed circuit board with the stem opposed to the second surface at the central portion,
    the flexible printed circuit board curves with the second surface facing outward at least at the central portion,
    the printed circuit board intervenes between edges of the first portion and the second portion and is connected to the flexible printed circuit board, and
    the first portion and the second portion of the flexible printed circuit board curves in a shape to avoid mutual contact and three-dimensionally intersect with each other, and the first portion and the second portion on the second surface are opposed to the printed circuit board.

2. The optical module according to claim 1, wherein
    the flexible printed circuit board on the second surface has a first ground terminal connected to the first ground plain,
    the printed circuit board on the third surface has a second ground terminal connected to the second ground plain,
    the first ground terminal and the second ground terminal are connected to each other.

3. The optical module according to claim 1, wherein
    the flexible printed circuit board at the central portion and the first portion on the first surface has a first interconnect pattern, the flexible printed circuit board at the first portion on the second surface having a first terminal connected to the first interconnect pattern,
    the printed circuit board has a third interconnect pattern, the printed circuit board on the third surface having a third terminal connected to the third interconnect pattern, and
    the first terminal and the third terminal are connected to each other.

4. The optical module according to claim 3, wherein
    the first ground plain is at the central portion and at the first portion and overlaps with the first interconnect pattern, and
    the first interconnect pattern includes a high-frequency signal line.

5. The optical module according to claim 3, wherein
    the flexible printed circuit board at the central portion and the second portion on the first surface has a second interconnect pattern, the flexible printed circuit board at the second portion on the second surface having a second terminal connected to the second interconnect pattern,
    the printed circuit board has a fourth interconnect pattern, the printed circuit board on the fourth surface having a fourth terminal connected to the fourth interconnect pattern, and
    the second terminal and the fourth terminal are connected to each other.

6. The optical module according to claim 5, wherein the second interconnect pattern includes a direct-current signal line.

7. The optical module according to claim 1, wherein one of the first portion and the second portion of the insulation film has an opening or a cutout.

8. The optical module according to claim 7, wherein the second portion has the opening or the cutout, and the first portion is situated inside the opening or the cutout.

\* \* \* \* \*